United States Patent [19]
Imoto

[11] Patent Number: 6,051,455
[45] Date of Patent: Apr. 18, 2000

[54] METHOD OF MAKING PLURALITY OF FETS HAVING DIFFERENT THRESHOLD VALUES

[75] Inventor: Tsutomu Imoto, Kanagawa, Japan

[73] Assignee: Sony Corporation, Tokyo, Japan

[21] Appl. No.: 09/015,314

[22] Filed: Jan. 29, 1998

[30] Foreign Application Priority Data

Jan. 31, 1997 [JP] Japan ................................ P09-019003

[51] Int. Cl.[7] ............................................... H01L 21/338
[52] U.S. Cl. ........................ 438/174; 438/194; 438/276
[58] Field of Search .................................. 438/174, 175, 438/194, 195, 217, 275, 276, 289

[56] References Cited

U.S. PATENT DOCUMENTS

| | | | |
|---|---|---|---|
| 4,013,483 | 3/1977 | Nuzillat et al. | 438/194 |
| 4,472,871 | 9/1984 | Green et al. | 438/276 |
| 4,937,075 | 6/1990 | Hollingsworth et al. | 438/275 |
| 5,100,831 | 3/1992 | Kuwata | 438/174 |
| 5,143,857 | 9/1992 | Finchem et al. | 438/174 |
| 5,192,701 | 3/1993 | Iwasaki | 438/174 |

Primary Examiner—Chandra Chaudhari
Attorney, Agent, or Firm—Hill & Simpson

[57] ABSTRACT

Disclosed is a method of fabricating a semiconductor device in which a plurality of FETs (Field Effect Transistors) having different threshold values are formed on the same substrate. The method includes the steps of: implanting ions of an impurity having a first conducting type in active regions of the plurality of FETs, to simultaneously form channel layers in the active regions; and implanting ions of an impurity having a second conducting type at bottom portion of the channel layers, to simultaneously form buried layers at the bottom portions of the channel layers; wherein a carrier concentration distribution in the active region of a specific one of the plurality of FETs is changed depending on a desired threshold value of the specific FET. In the semiconductor device fabricated in accordance with the method, each of the FETs is allowed to exhibit a desired electric characteristic and a desired controllability of a threshold value.

12 Claims, 9 Drawing Sheets

FIG. 2
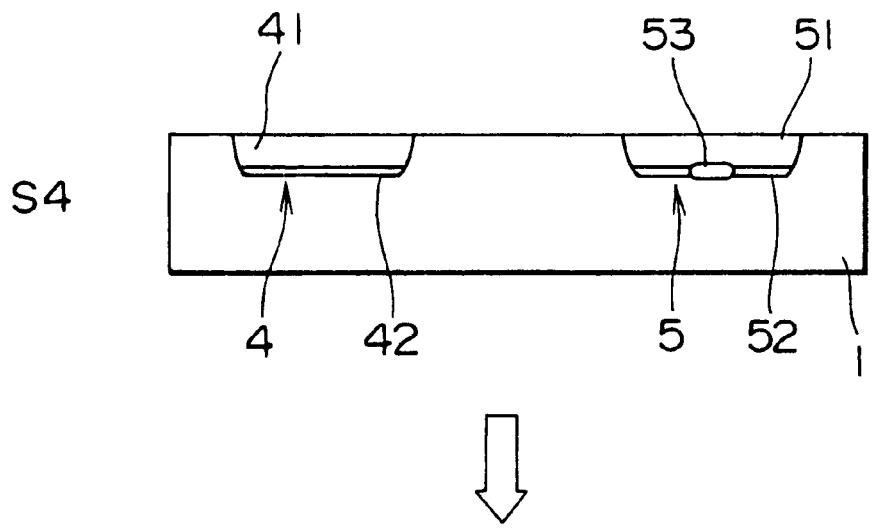
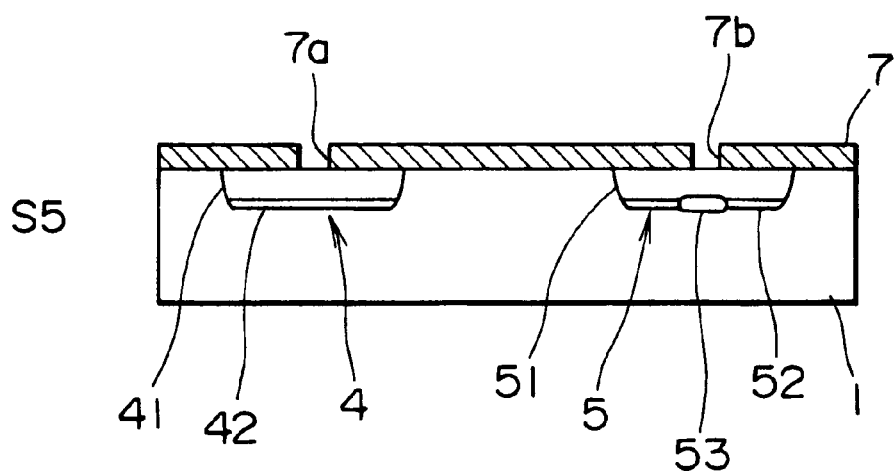

METHOD OF MAKING PLURALITY OF FETS HAVING DIFFERENT THRESHOLD VALUES

BACKGROUND OF THE INVENTION

The present invention relates to a semiconductor device in which a plurality of FETs (Field Effect Transistors) having different threshold values are formed on the same substrate, and a method of fabricating the semiconductor device.

In recent years, as an integrated circuit to be operated at a high speed and at a high frequency, there has been used a type in which a plurality of FETs having different threshold values, for example, a DFET (Depletion type FET) and an EFET (Enhancement type FET) are formed on the same semiconductor substrate.

The semiconductor device of this type has been known, for example, from Japanese Patent Laid-open No. Hei 2-192734. In this document, there is disclosed a fabrication structure of an invertor circuit composed of a DCFL (Direct Coupled FET Logic) circuit using a MESFET (Schottky Gate Type FET). To be more specific, active layers of a first conducting type (N-type active layers) of a DFET and an EFET are formed at the same ion implantation step, and with respect to the EFET, a layer doped with an impurity of a second conducting type (P-type doped layer) is formed at the bottom portion of the active layer of the first conducting type.

With this configuration, it becomes possible to reduce the number of fabrication steps and hence to increase the yield, to stabilize a balance in threshold value between the DFET and EFET, and to suppress a short channel effect of the EFET.

Incidentally, a semiconductor device having a plurality of FETs having different threshold values is required to be applied to a MMIC (Monolithic Microwave Integrated Circuit) containing a logic circuit, and the like. Such a MMIC has been used for a high frequency circuit block at a terminal of mobile communication such as a PHS. An analog circuit portion of a MMIC includes an antenna switch, a low noise amplifier, a mixer, a power amplifier, and a circuit with these components combined on the same substrate. In such a MMIC, it is required to increase performances of both a DFET and an EFET. To be more specific, in order to improve characteristics, for example, increase a gain or decrease an on-resistance not only in an EFET but also in a DFET, it is required to shorten a gate length or make thin a channel layer and increase an impurity concentration of the channel layer.

In the above-described related art semiconductor device, however, the DFET is used only as a resistance in the DCFL circuit and a buried layer of the second conducting type is not formed at the bottom portion of the DFET, and consequently, there occurs a large short channel effect even in the case where a gate length of the DFET is shortened, and thereby sufficient characteristics of the DFET cannot be obtained and also a controllability of a threshold value of the DFET is degraded. As a result, it fails to attain a high performance of the DFET, thus leading to a problem that the semiconductor device including such a DFET cannot be applied to a MMIC and the like.

On the other hand, in the actual fabrication step, a controllability of a threshold value is degraded due to the fact that a dose of an impurity doped by an ion implantation system varies between batches. To be more specific, in the case where ions of an impurity are implanted in FETs being different in desired threshold value at different steps, there arises a problem that a variation in the dose of the impurity between batches causes a deviation from a desired difference between threshold values of the FETs (hereinafter, referred to as "a relative deviation"), leading to such a failure that if one threshold value is in a suitable range, another one is out of a suitable range.

OBJECT AND SUMMARY OF THE INVENTION

An object of the present invention is to provide a semiconductor device in which each of a plurality of FETs having different threshold values exhibits a desired electric characteristic enough to meet the needs of a MMIC or the like and also exhibits a desired controllability of the threshold value, and a method of fabricating the semiconductor device.

To achieve the above object, according to the present invention, there is provided a method of fabricating a semiconductor device in which a plurality of FETs (Field Effect Transistors) having different threshold values are formed on the same substrate, including the steps of: implanting ions of an impurity having a first conducting type in active regions of the plurality of FETs, to simultaneously form channel layers in the active regions; and implanting ions of an impurity having a second conducting type at bottom portion of the channel layers, to simultaneously form buried layers at the bottom portions of the channel layers; wherein a carrier concentration distribution in the active region of a specific one of the plurality of FETs is changed depending on a desired threshold value of the specific FET.

According to the above method, since ions of an impurity of a second conducting type are implanted in bottom portions of channel layers of a plurality of FETs to simultaneously form buried layers at the bottom portions of the channel layers, the channel of each FET can be thinned and heavily doped with the impurity. This is effective to suppress a short channel effect even when a gate length is shortened, and hence to improve an electric characteristic at a high frequency. Further, by changing a carrier concentration distribution in the active region of a specific FET depending on a desired threshold value of the specific FET, the threshold value can be certainly controlled by a simple processing manner. Further, except for a step for making different threshold values of FETs, implantation of an impurity is performed for all of the FETs at the same processing step, so that it is possible to reduce the relative deviation between threshold values of the FETs due to a variation in a dose between batches, and hence to obtain a good controllability of the threshold value.

BRIEF DESCRIPTION OF THE DRAWINGS

FIGS. 1 to 3 are views showing Steps S1 to S7 of fabricating a semiconductor device according to a first embodiment;

DETAILED DESCRIPTION OF PREFERRED EMBODIMENTS

Hereinafter, preferred embodiments of the present invention will be described with reference to the accompanying drawings.

Figure 1:
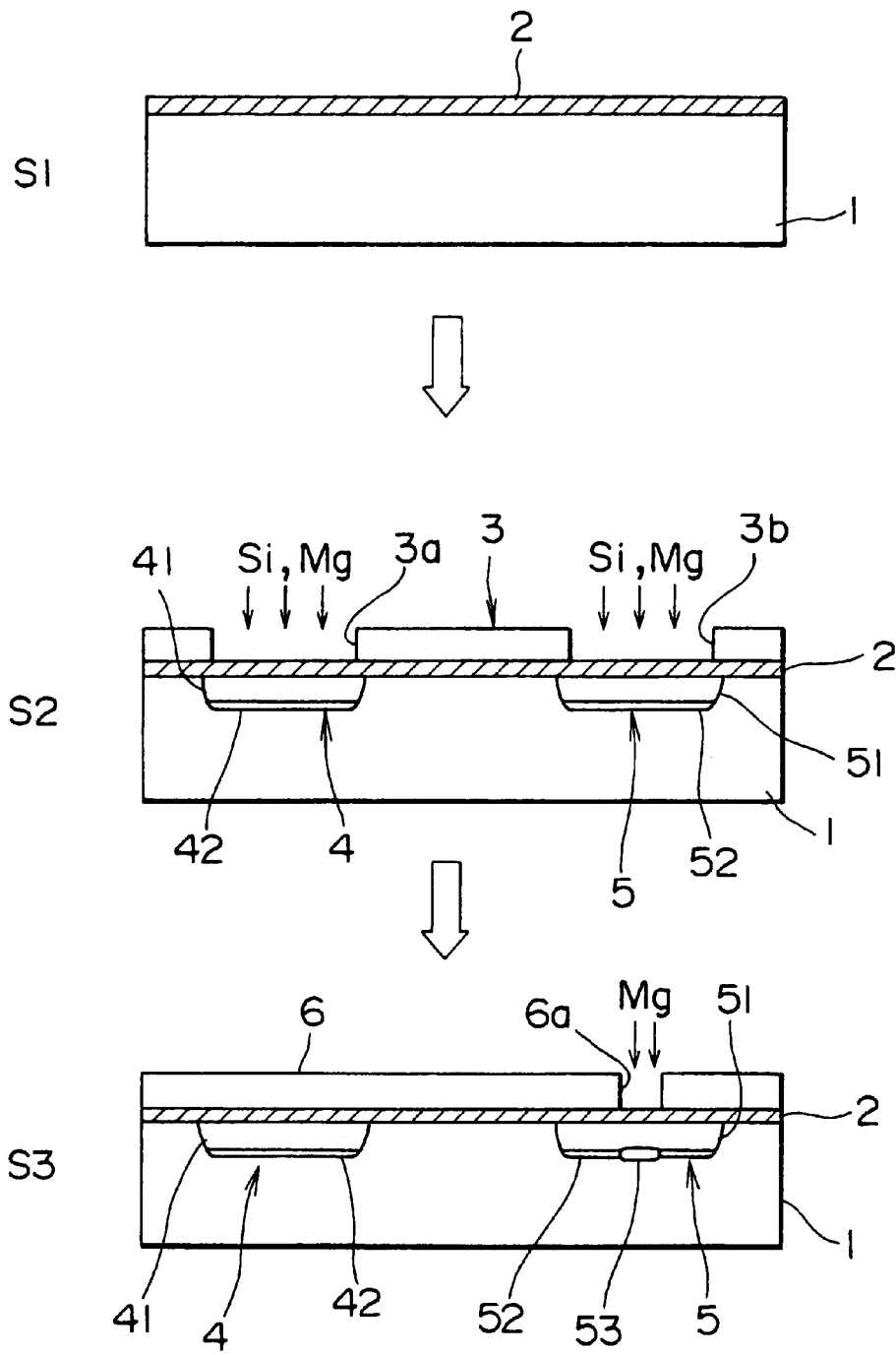
Figure 3:
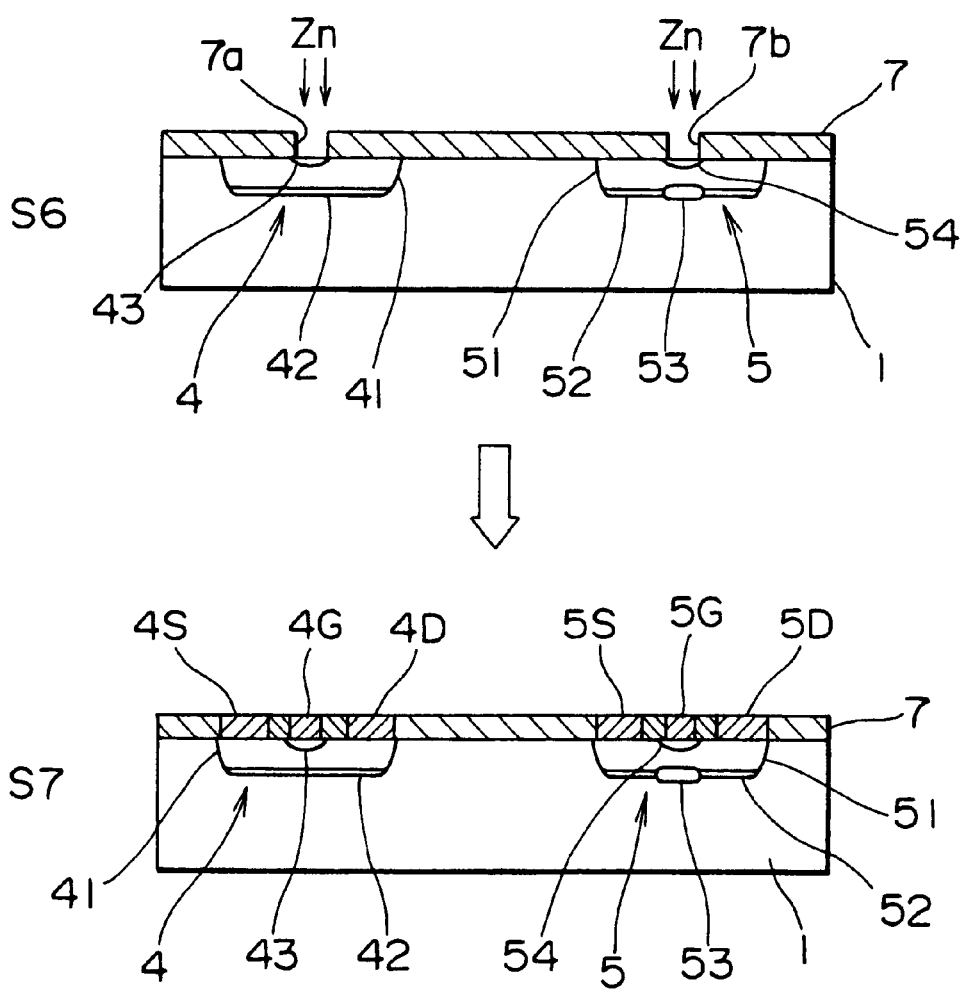

FIGS. 1 to 3 are views showing steps of fabricating a semiconductor device according to a first embodiment of the present invention, wherein FIG. 1 shows Steps S1 to S3; FIG. 2 shows Steps S4 and S5; and FIG. 3 shows Steps S6 and S7. Here, as FETs having different threshold values, an N-type DFET and an N-type EFET, each of which is a JFET (Junction Type FET), are simultaneously formed on the same substrate.

First, as shown at Step S1 of FIG. 1, a film 2 made from silicon nitride (for example, $Si_3N_4$) is deposited on a substrate 1 made from, for example, GaAs (gallium arsenide) to a thickness of 50 nm by a CVD (Chemical Vapor Deposition) process.

Then, as shown at Step S2, the substrate 1 is covered with a resist film 3, and windows 3a and 3b are formed in the resist film 3 at portions of an active region 4 of a DFET and an active region 5 of an EFET. In such a state, ions of silicon (Si) as an impurity of a first conducting type are implanted, to form N-type channel layers 41 and 51 in the active regions 4 and 5, respectively. Further, ions of magnesium (Mg) as an impurity of a second conducting type are implanted, to form buried layers 42 and 52 at bottom portions of the active layers 4 and 5, respectively. In addition, at Step S2, the channel layers 41 and 51 are heavily doped with ions of the impurity, and at this stage, the active regions 4 and 5 are both formed as DFETs.

Next, as shown at Step S3, the resist film 3 is removed and a resist film 6 is newly formed, and a window 6a is formed in the resist film 6 at a portion including a gate region of the active region 5 and the vicinity thereof. Then, ions of Mg are additionally implanted in the substrate 1 using the resist film 6 as a mask, to form a buried layer 53 being higher in concentration of Mg than the buried layers 42 and 52, in the buried layer 52 at the bottom portion of the channel layer 51 of the active region 5.

The process goes on to Step S4 of FIG. 2, at which the resist film 6 and the silicon nitride film 2 are removed, followed by activation annealing for Si and Mg, to make the active regions 4 and 5 conductive.

Then, as shown at Step S5, a silicon nitride film 7 is deposited on the substrate 1, and diffusion windows 7a and 7b are formed in the silicon nitride film 7 at portions corresponding to the gate regions of the active regions 4 and 5.

The process goes on to Step S6 of FIG. 3, at which zinc (Zn) is diffused through the diffusion windows 7a and 7b by heating the substrate 1 in an atmosphere containing DEZ (diethylzinc) at about 600° C., to form p-type regions 43 and 54 in the channel layers 41 and 51, respectively, thus forming p-n junctions as gates of JFETs.

Finally, as shown at Step S7, gate electrodes 4G and 5G are formed through the diffusion windows 7a and 7b respectively, and source electrodes 4S and 5S and drain electrodes 4D and 5D, having ohmic contact, are formed in the channels 41 and 51, respectively. At this time, the depths of the p-n junctions in the p-type active regions 54 and 43 of the right and left FETs are substantially equal to each other; however, since the heavily doped buried layer 53 is formed on the active region 5 side, a threshold value of the EFET is shifted on the positive side as compared with a threshold value of the DFET. Thus, an enhancement mode is realized.

In this way, according to this embodiment, since the buried layers 42 and 52 are simultaneously formed at the bottom portions of the channel layers 41 and 51 of the DFET and EFET as the FETs having different threshold values, the channel of each FET can be thinned and heavily doped with the impurity. This makes it possible to suppress a short channel effect even when a gate length is shortened, and hence to improve electric characteristics at a high frequency to such an extent as to meet the needs of a MMIC and the like.

Further, in this embodiment, except for the step (Step S3) of making different the threshold values of the right and left FETs, implantation of ions of an impurity for the right and left FETs is performed at the same step (Step S2). Accordingly, a variation in dose at Step S2 is the same in terms of direction and amount for the right and left FETs, so that there little occurs "a relative deviation" between the threshold values of the right and left FETs. Besides, if ions of Si and Mg (which are implanted at Step S2 in this embodiment) are implanted in the right and left FETs at different steps as in the related art method, a deviation from a desired threshold at the right FET is not equal to that at the left FET due to a variation in dose between batches, as a result of which there occurs "a relative deviation" between the threshold values of the right and left FETs.

On the contrary, in this embodiment, since ions of Si and Mg are simultaneously implanted in the right and left FETs at Step S2, the "relative deviation" between the threshold values of the right and left FETs is reduced as compared with the above-described related art manner in which ions of Si and Mg are implanted in the right and left FETs at different steps.

Further, in this embodiment, since the buried region 53 is formed only in the region including the gate region of the active region 5 and the vicinity thereof, it is possible to reduce external resistances between the gate 5G and the source 5S and between gate 5G and the drain 5D, and hence to reduce the on-resistance.

Besides, reversely to the above manner, active regions 4 and 5 may be formed as EFETs by lowering concentrations of Si doped in channel layers 41 and 51, and ions of the same impurity as that doped in the channel layer 51, that is, ions of Si may be implanted in a buried layer 52 of the active region 5 to form a lightly doped buried region 53. This makes it possible to shift the threshold value of the active region 5 on the negative side, and hence to form a DFET on the active region 5 side. As a result, like the above case, two kinds of FETS, the DFET and EFET can be formed on the substrate 1.

In this embodiment, as the two FETs having different threshold values, the junction type DFET and EFET are formed on the same substrate; however, the present invention is not limited thereto. For example, the present invention can be applied to a combination of two DFETs or two EFETs having different threshold values.

Next, a second embodiment of the present invention will be described.

Figure 4:
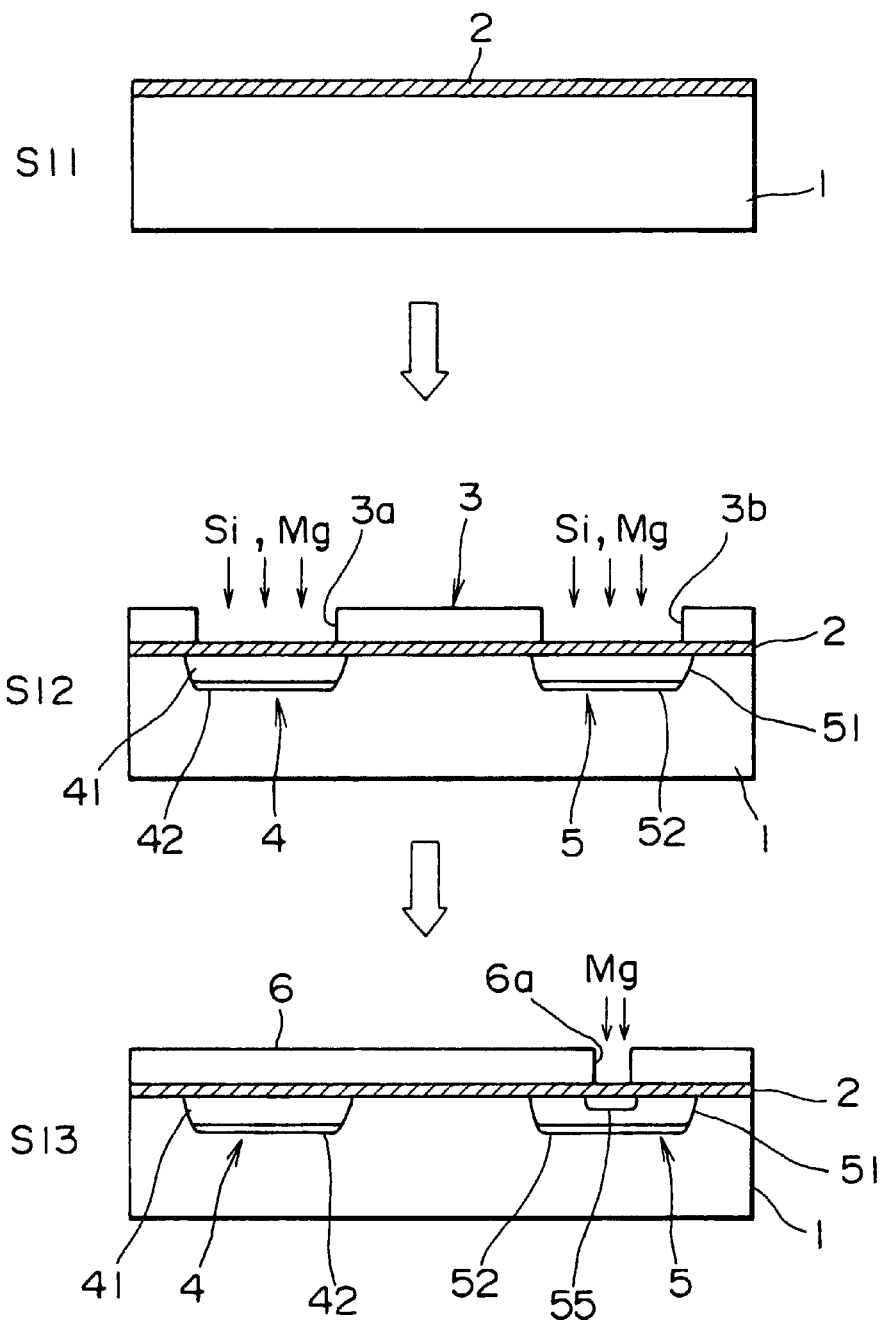
FIGS. 4 and 5 are views showing Steps S11 to S16 of fabricating a semiconductor device according to a second embodiment of the present invention.
Figure 5:
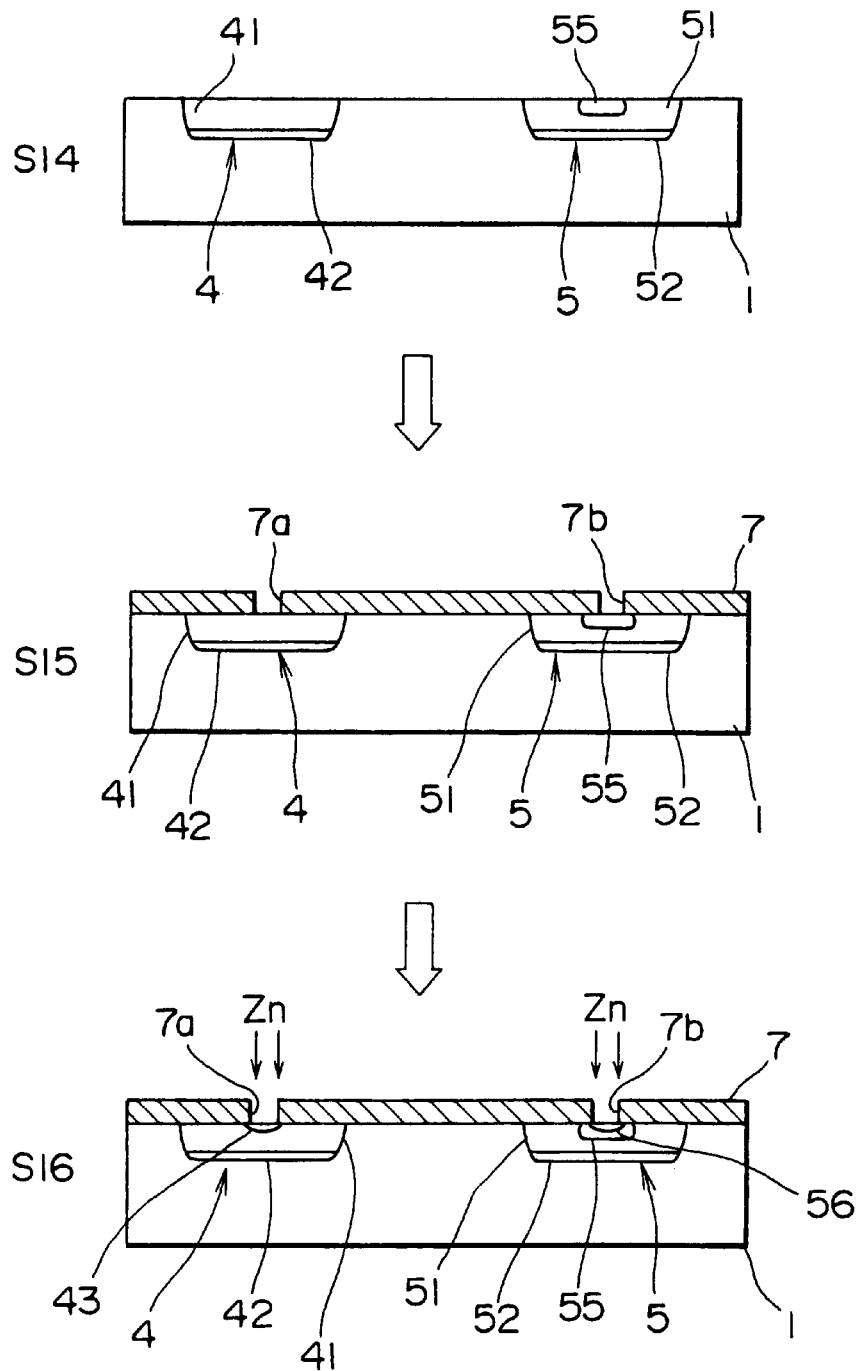

FIGS. 4 and 5 are views showing steps of fabricating a semiconductor device according to a second embodiment of the present invention, wherein FIG. 4 shows Steps S11 to S13, and FIG. 5 shows Steps S14 and S16. In addition, parts corresponding to those in the first embodiment shown in FIGS. 1 to 3 are indicated by the same reference numerals.

First, as shown at Step S11 of FIG. 4, a film 2 made from silicon nitride (for example, $Si_3N_4$) is deposited on a substrate 1 made from, for example, GaAs to a thickness of 50 nm by CVD.

Then, as shown at Step S12, the substrate 1 is covered with a resist film 3, and windows 3a and 3b are formed in the resist film 3 at portions of an active region 4 of a DFET and an active region 5 of an EFET. In such a state, ions of silicon (Si) as an impurity of a first conducting type are implanted, to form N-type channel layers 41 and 51 in the active regions 4 and 5, respectively. Further, ions of magnesium (Mg) as an impurity of a second conducting type are implanted, to form buried layers 42 and 52 at bottom portions of the active layers 4 and 5, respectively. In addition, at Step S12, the channel layers 41 and 51 are heavily doped with ions of the impurity, and at this stage, the active regions 4 and 5 are both formed as DFETs.

Next, as shown at Step S13, the resist film 3 is removed and a resist film 6 is newly formed, and a window 6a is formed in the resist film 6 at a portion including a gate region of the active region 5 and the vicinity thereof. Then, ions of the same impurity as that doped in the buried layers 42 and 52, that is, ions of Mg are additionally implanted in the substrate 1 using the resist film 6 as a mask, to form a buried layer 55 being lower in effective impurity concentration, in the channel layer 51 of the active region 5.

The process goes on to Step S14 of FIG. 5, at which the resist film 6 and the silicon nitride film 2 are removed, followed by activation annealing for Si and Mg, to make the active regions 4 and 5 conductive.

Then, as shown at Step S15, a silicon nitride film 7 is deposited on the substrate 1, and diffusion windows 7a and 7b are formed in the silicon nitride film 7 at portions corresponding to the gate regions of the active regions 4 and 5.

Next, as shown at Step S16, zinc (Zn) is diffused through the diffusion windows 7a and 7b by heating the substrate 1 in an atmosphere containing DEZ (diethylzinc) at about 600° C., to form p-type regions 43 and 56 in the channel layers 41 and 51, respectively, thus forming gates of JFETs. Finally, like the first embodiment, gate electrodes, source electrodes, and drain electrodes are formed through the diffusion windows 7a and 7b.

As a result, the depths of the p-n junctions in the p-type regions 56 and 43 of the right and left FETs are substantially equal to each other; however, since the buried layer 55 is formed in the channel region 51 by implantation of Mg ions, the concentration of the channel layer 51 is lowered, and thereby a threshold value of the active region 5 is shifted to the positive side as compared with a threshold value of the DFET. Thus, an enhancement mode is realized.

In this embodiment, like the first embodiment, since the buried layers 42 and 52 are simultaneously formed at the bottom portions of the channel layers 41 and 51 of the DFET and EFET, the channel of each FET can be thinned and heavily doped with an impurity. This makes it possible to suppress a short channel effect even when a gate length is shortened, and hence to improve electric characteristics at a high frequency to such an extent as to meet the needs of a MMIC and the like.

Further, in this embodiment, since ions of the same impurity as that doped in the buried layer 52 are additionally implanted in the channel layer 51 of the active region 5 to form the buried region 56, it is possible to shift the threshold value of the active region 5 on the positive side as compared with that of the DFET by a simple processing step.

Besides, reversely to the above manner, active regions 4 and 5 may be formed as EFETs by lowering concentrations of Si doped in channel layers 41 and 51, and ions of the same impurity as that doped in the channel layer 51, that is, ions of Si may be implanted in the channel layer 51 of the active region 5 to form a highly doped buried region 56. This makes it possible to shift the threshold value of the active region 5 on the negative side, and hence to form a DFET on the active region 5 side. As a result, like the above case, two kinds of FETs, the DFET and EFET can be formed on the substrate 1.

Next, a third embodiment of the present invention will be described.

Figure 6:
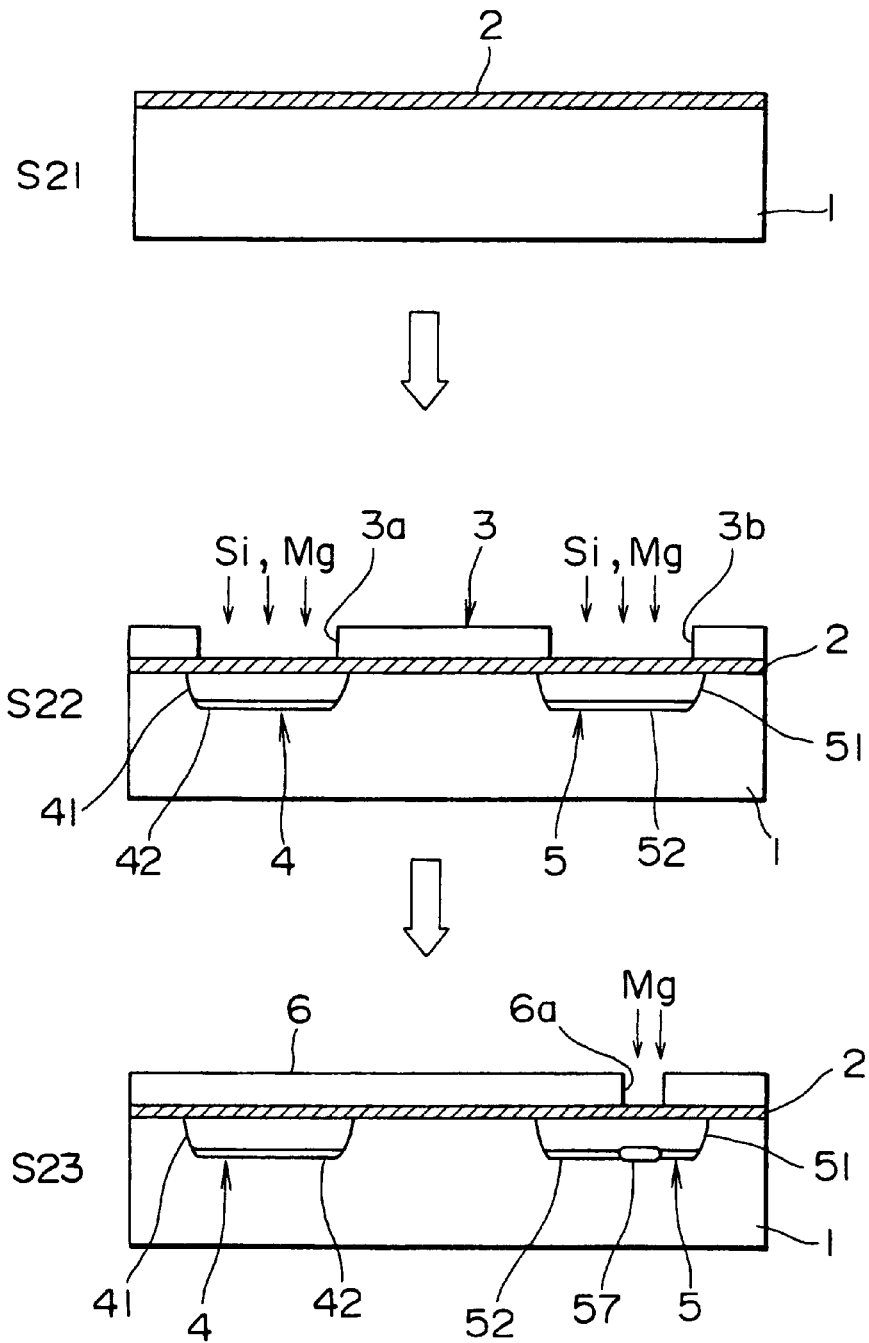
FIGS. 6 and 7 are views showing Steps S21 to S26 of fabricating a semiconductor device according to a third embodiment.
Figure 7:
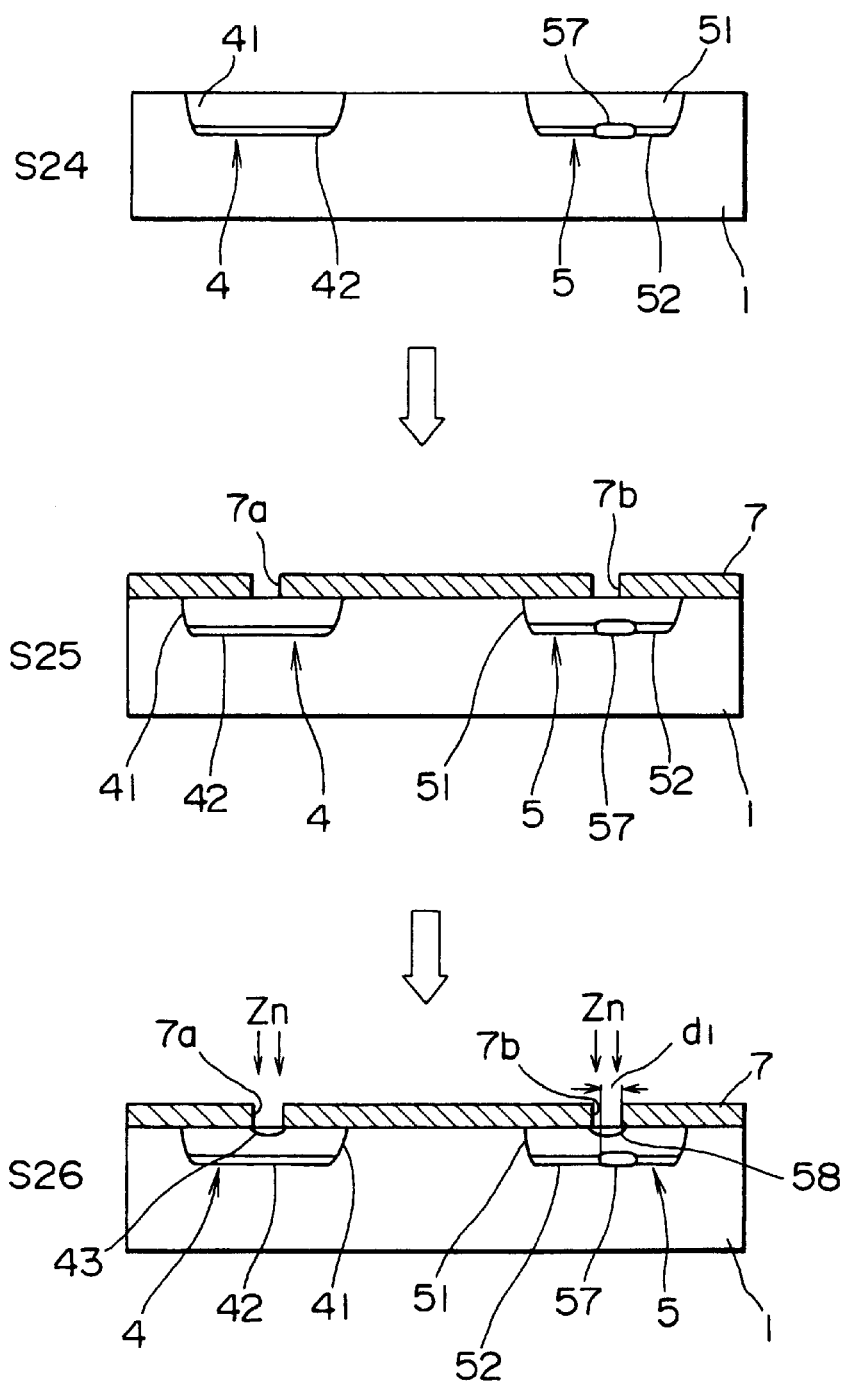

FIGS. 6 and 7 are views showing steps of fabricating a semiconductor device according to a third embodiment of the present invention, wherein FIG. 6 shows Steps S21 to S23, and FIG. 7 shows Steps S24 to S26. In addition, parts corresponding to those in the first embodiment shown in FIGS. 1 to 3 are indicated by the same reference numerals.

First, as shown at Step S21 of FIG. 6, a film 2 made from silicon nitride (for example, $Si_3N_4$) is deposited on a substrate 1 made from, for example, GaAs to a thickness of 50 nm by CVD.

Then, as shown at Step S22, the substrate 1 is covered with a resist film 3, and windows 3a and 3b are formed in the resist film 3 at portions of an active region 4 of a DFET and an active region 5 of an EFET. In such a state, ions of silicon (Si) as an impurity of a first conducting type are implanted, to form N-type channel layers 41 and 51 in the active regions 4 and 5, respectively. Further, ions of magnesium (Mg) as an impurity of a second conducting type are implanted, to form buried layers 42 and 52 at bottom portions of the active layers 4 and 5, respectively. In addition, at Step S22, the channel layers 41 and 51 are heavily doped with ions of the impurity, and at this stage, the active regions 4 and 5 are both formed as DFETs.

Next, as shown at Step S23, the resist film 3 is removed and a resist film 6 is newly formed, and a window 6a is formed in the resist film 6 at a portion including a gate region of the active region 5 and the vicinity thereof. Then, ions of Mg are additionally implanted in the substrate 1 using the resist film 6 as a mask, to form a buried layer 57 being higher in concentration of Mg than the buried layers 42 and 52, in the buried layer 52 at the bottom portion of the channel layer 51 of the active region 5.

The process goes on to Step S24 of FIG. 7, at which the resist film 6 and the silicon nitride film 2 are removed, followed by activation annealing for Si and Mg, to make the active regions 4 and 5 conductive.

Then, as shown at Step S25, a silicon nitride film 7 is deposited on the substrate 1, and diffusion windows 7a and 7b are formed in the silicon nitride film 7 at portions corresponding to the gate regions of the active regions 4 and 5. At this time, the diffusion window 7b on the active region 5 side is formed at a position being a specific distance offset from the buried region 57.

As shown at Step S26, zinc (Zn) is diffused through the diffusion windows 7a and 7b by heating the substrate 1 in an atmosphere containing DEZ (diethylzinc) at about 600° C., to form p-type regions 43 and 58 in the channel layers 41 and 51, respectively, thus separating p-n junction.

Finally, like the first embodiment, gate electrodes, source electrodes, and drain electrodes are formed through the diffusion windows 7a and 7b. At this time, the depths of the p-n junctions in the p-type active regions 58 and 43 of the right and left FETs are substantially equal to each other; however, since the buried region 57 is formed in the channel region 51, a threshold value of the active region 5 is shifted on the positive side as compared with a threshold value of the DFET. Thus, an enhancement mode is realized.

At the gate electrode portion of the active region 5 thus formed, an effective gate length becomes a length $d_1$ at which the gate region is overlapped on the buried region 57. Accordingly, there can be obtained a gate length finer than a resolution of lithography. Here, the length $d_1$ is desired to be constant over the entire width of the gate.

In addition, the third embodiment can be applied to the second embodiment. To be more specific, the same effect as that in this embodiment can be obtained by a manner in which at Step S15 of FIG. 5, the diffusion window 7b may be formed to be a specific distance offset from the buried region 55. However, to apply this embodiment to the second embodiment, it is required that a portion at which the buried region is overlapped on the gate region is higher in threshold value than a portion other than the overlapped portion. Accordingly, the application of this embodiment to the first and second embodiments can be carried out only on the basis of the pattern in which the active regions 4 and 5 are previously formed as DFETS, and only the active region 5 is converted into an EFET.

Next, a fourth embodiment of the present invention will be described.

Figure 8:
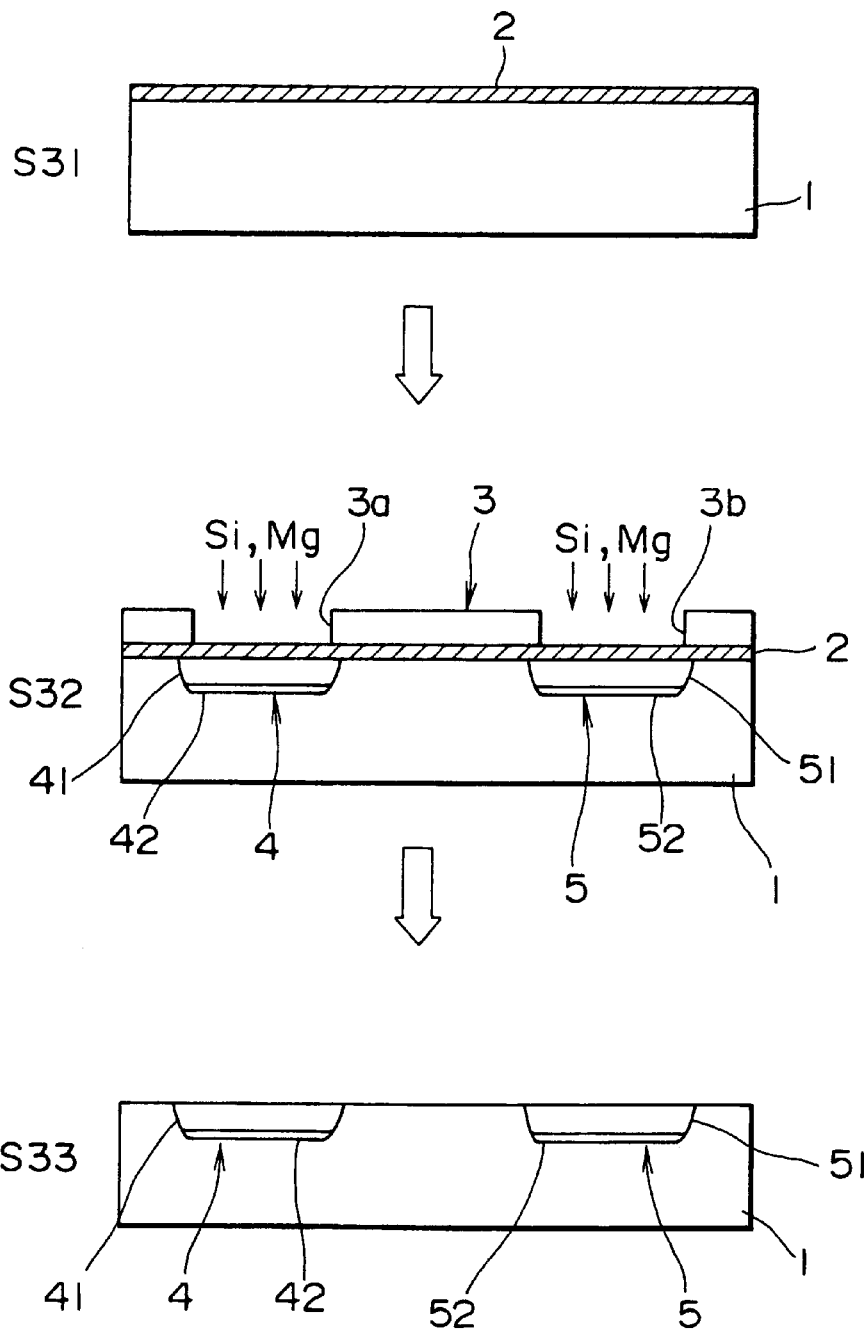
FIGS. 8 and 9 are views showing Steps S31 to S36 of fabricating a semiconductor device according to a fourth embodiment.
Figure 9:
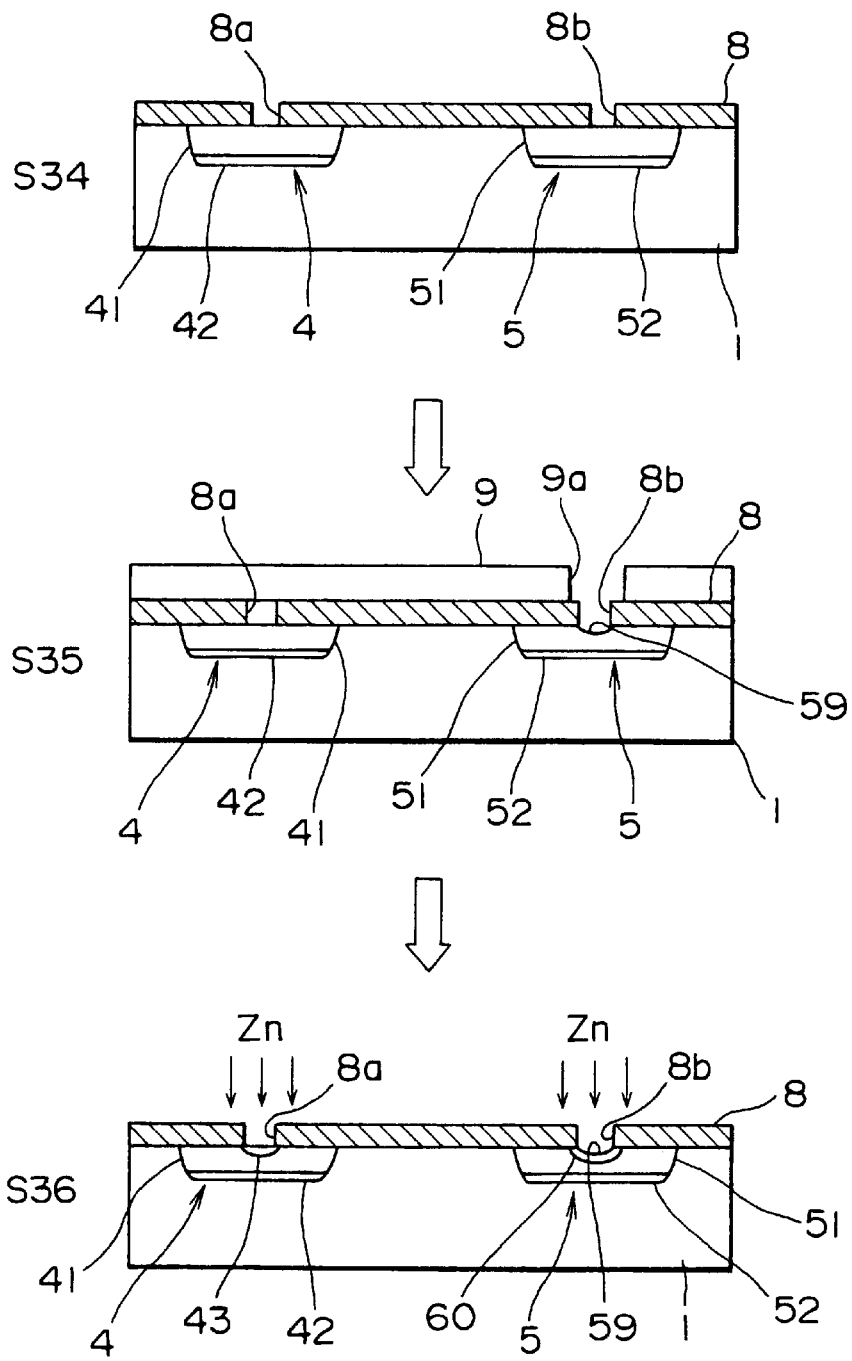

FIGS. 8 and 9 are views showing steps of fabricating a semiconductor device according to a fourth embodiment of the present invention, wherein FIG. 8 shows Steps S31 to S33, and FIG. 9 shows Steps S34 and S36. In addition, parts corresponding to those in the first embodiment shown in FIGS. 1 to 3 are indicated by the same reference numerals.

First, as shown at Step S31 of FIG. 8, a film 2 made from silicon nitride (for example, $Si_3N_4$) is deposited on a substrate 1 made from, for example, GaAs to a thickness of 50 nm by CVD.

Then, as shown at Step S32, the substrate 1 is covered with a resist film 3, and windows 3a and 3b are formed in the resist film 3 at portions of an active region 4 of a DFET and an active region 5 of an EFET. In such a state, ions of silicon (Si) as an impurity of a first conducting type are implanted, to form N-type channel layers 41 and 51 in the active regions 4 and 5, respectively. Further, ions of magnesium (Mg) as an impurity of a second conducting type are implanted, to form buried layers 42 and 52 at bottom portions of the active layers 4 and 5, respectively. In addition, at Step S32, the channel layers 41 and 51 are heavily doped with ions of the impurity, and at this stage, the active regions 4 and 5 are both formed as DFETS.

Next, as shown at Step S33, the resist film 3 and the silicon nitride film 2 are removed, followed by activation annealing for Si and Mg, to make the active regions 4 and 5 conductive.

The process goes on to Step S34 of FIG. 9, at which a silicon nitride film 8 is deposited on the substrate 1, and diffusion windows 8a and 8b are formed in the silicon nitride film 7 at portions corresponding to the gate regions of the active regions 4 and 5. Further, at Step S35, a resist film 9 is formed to cover the silicon nitride film 8. At this time, a window 9a slightly larger than the diffusion window 8b is formed in the resist film 9 at a portion corresponding to the diffusion window 8b. In such a state, the entire substrate 1 is dipped in an etching solution, to cut a substrate surface 59 in the active region 5 using the silicon nitride film 8 as a mask. At this time, as the etching solution, there is used a solution having a composition of phosphoric acid:hydrogen peroxide:water=3:1:50 at a temperature of 10° C.

Then, as shown at Step S36, zinc (Zn) is diffused through the diffusion windows 8a and 8b by heating the substrate 1 in an atmosphere containing DEZ (diethylzinc) at about 600° C., to form p-type regions 43 and 60 in the channel layers 41 and 51, respectively, thus separating p-n junction.

Finally, like the first embodiment, gate electrodes, source electrodes, and drain electrodes are formed through the diffusion windows 8a and 8b. At this time, the depths of the p-n junctions in the p-type regions 60 and 43 of the right and left FETs are substantially equal to each other; however, since the substrate surface 59 of the channel layer 51 is cut, the thickness of the channel layer 51 is made thin directly under the P-type region 60. That is, a threshold value of the active region 5 is shifted to the positive side as compared with a threshold value of the DFET. Thus, an enhancement mode is realized.

Although the first, second, third, and fourth embodiment are described by example of formation of the JFET, the present invention can be applied to formation of a MESFET, HEMT and the like. In the case of the MESFET, the gate diffusion step shown at Step S6 of FIG. 3 may be replaced with a step of forming a Schottky electrode (for example, a step of forming a multi-layer metal film of Ti/Pt/Au=50/50/200 nm by electron beam vapor-deposition).

While the preferred embodiments have been described using the specific terms, such description is for illustrative purposes only, and it is to be understood that many changes and variations may be made without departing from the spirit or scope of the following claims.

What is claimed is:

1. A method of fabricating a semiconductor device in which a plurality of FETs (Field Effect Transistors) having different threshold values are formed on the same substrate, comprising the steps of:

implanting ions of an impurity having a first conducting type in active regions of the plurality of FETs, to simultaneously form channel layers in the active regions; and implanting ions of an impurity having a second conducting type at bottom portion of the channel layers, to simultaneously form buried layers at the bottom portions of the channel layers;

wherein a carrier concentration distribution in the active region of a specific one of the plurality of FETs is changed depending on a desired threshold value of the specific FET.

2. A method of fabricating a semiconductor device according to claim 1, further comprising the step of additionally implanting the impurity having the second conducting type in the buried layer of the specific FET, to change the carrier concentration distribution depending on the desired threshold value.

3. A method of fabricating a semiconductor device according to claim 1, further comprising the step of additionally implanting the impurity having the first conducting type in the buried layer of the specific FET, to change the carrier concentration distribution depending on the desired threshold value.

4. A method of fabricating a semiconductor device according to claim 1, further comprising the step of additionally implanting the impurity having the second conducting type in the channel layer of the specific FET, to change the carrier concentration distribution depending on the desired threshold value.

5. A method of fabricating a semiconductor device according to claim 1, further comprising the step of additionally implanting the impurity having the first conducting type in the channel layer of the specific FET, to change the carrier concentration distribution depending on the desired threshold value.

6. A method of fabricating a semiconductor device according to claim 2, wherein the region additionally implanted with the impurity is provided in the entire area directly under a gate and the vicinity thereof.

7. A method of fabricating a semiconductor device according to claim 4, wherein the region additionally implanted with the impurity is provided in the entire area directly under a gate and the vicinity thereof.

8. A method of fabricating a semiconductor device according to claim 2, wherein an area in which the region additionally implanted with the impurity is overlapped on a gate is shorter than a gate length.

9. A method of fabricating a semiconductor device according to claim 4, wherein an area in which the region additionally implanted with the impurity is overlapped on a gate is shorter than a gate length.

10. A method of fabricating a semiconductor device according to claim 1, wherein the carrier concentration distribution is changed depending on the desired threshold value by etching the surface of the substrate in a gate region of the specific FET.

11. A method of fabricating a semiconductor device according to claim 1, wherein the FET is a MESFET (Schottky Gate Type FET).

12. A method of fabricating a semiconductor device according to claim 1, wherein the FET is a JFET (Junction Type FET).

* * * * *